(12) United States Patent
Xie et al.

(10) Patent No.: US 8,987,074 B2
(45) Date of Patent: Mar. 24, 2015

(54) OXIDE SEMICONDUCTOR THIN FILM TRANSISTOR, MANUFACTURING METHOD, AND DISPLAY DEVICE THEREOF

(71) Applicant: Beijing BOE Optoelectronics Technology Co., Ltd., Beijing (CN)

(72) Inventors: Zhenyu Xie, Beijing (CN); Shaoying Xu, Beijing (CN); Changjiang Yan, Beijing (CN); Tiansheng Li, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/983,868

(22) PCT Filed: Feb. 27, 2013

(86) PCT No.: PCT/CN2013/071939
§ 371 (c)(1),
(2) Date: Aug. 6, 2013

(87) PCT Pub. No.: WO2013/127337
PCT Pub. Date: Sep. 6, 2013

(65) Prior Publication Data
US 2014/0103334 A1    Apr. 17, 2014

(30) Foreign Application Priority Data

Feb. 28, 2012  (CN) ..................... 2012 2 0069853 U

(51) Int. Cl.
H01L 21/84   (2006.01)
H01L 27/14   (2006.01)
(52) U.S. Cl.
USPC ........................................ 438/157; 257/72

(58) Field of Classification Search
USPC ............ 438/104, 157, 283; 257/E29.296, 43, 257/57, 72
See application file for complete search history.

(56) References Cited

U.S. PATENT DOCUMENTS

| | | | |
|---|---|---|---|
| 8,304,765 B2 * | 11/2012 | Yamazaki et al. | ............... 257/43 |
| 2010/0032665 A1 | 2/2010 | Yamazaki et al. | |
| 2011/0140095 A1 | 6/2011 | Kim et al. | |

(Continued)

FOREIGN PATENT DOCUMENTS

| | | |
|---|---|---|
| CN | 101645462 A | 2/2010 |
| CN | 102097487 A | 10/2010 |

(Continued)

OTHER PUBLICATIONS

English translation of Chinese Publication No. 101645462, 86pgs.

(Continued)

*Primary Examiner* — Calvin Lee

(57) ABSTRACT

An oxide semiconductor thin film transistor, a manufacturing method and a display device thereof are disclosed. An oxide semiconductor thin film transistor comprises a gate insulating layer (22), an oxide semiconductor layer (24) and a blocking layer (25), wherein a first transition layer (23) is formed between the gate insulating layer (22) and the oxide semiconductor layer (24), the oxygen content of the first transition layer (23) is higher than the oxygen content of the oxide semiconductor layer (24). The oxide semiconductor thin film transistor enhances the interface characteristic and the lattice matching between the oxide semiconductor layer (24) and the blocking layer (25) to improve the stability of the thin film transistor better.

18 Claims, 2 Drawing Sheets

(56) References Cited

U.S. PATENT DOCUMENTS

| | | | |
|---|---|---|---|
| 2012/0168743 A1 | 7/2012 | Lee et al. | |
| 2014/0084281 A1* | 3/2014 | Yeh et al. | 257/43 |
| 2014/0103334 A1 | 4/2014 | Xie et al. | |

FOREIGN PATENT DOCUMENTS

| | | | |
|---|---|---|---|
| CN | 102169907 A | 3/2011 |
| CN | 202443973 U | 2/2012 |
| JP | 2010080947 A | 4/2010 |
| JP | 2011138934 A | 7/2011 |

OTHER PUBLICATIONS

English translation of Chinese Publication No. 102097487, 19pgs.
English translation of Chinese Publication No. 102169907, 17pgs.
English translation of Chinese Publication No. 202443973, 13pgs.
English translation of Japanese Publication No. 2010-80947, 19pgs.
English translation of Japanese Publication No. 2011-138934, 9pgs.
International Search Report for International Application No. PCT/CN2013//071939, 12pgs.
International Preliminary Report on Patentability for International Application No. PCT/CN2013/071939 dated Sep. 2, 2014, 7pgs.

* cited by examiner

OXIDE SEMICONDUCTOR THIN FILM TRANSISTOR, MANUFACTURING METHOD, AND DISPLAY DEVICE THEREOF

CROSS REFERENCE TO RELATED APPLICATIONS

This application is based on International Application No. PCT/CN2013/071939 filed on Feb. 27, 2013, which claims priority to Chinese National Application No. 201220069853.7, filed on Feb. 28, 2012, the contents of which are incorporated herein by reference.

TECHNICAL FIELD

Embodiments of the present invention relate to the field of semiconductor technology, particularly relate to an oxide semiconductor thin film transistor, a manufacturing method thereof, and a display device using the oxide semiconductor thin film transistor.

BACKGROUND

As a representative of thin-film transistor (TFT), oxide semiconductor thin film transistor is considered as the next generation of thin film transistor (TFT) used in displays.

In a TFT drive substrate, a typical transparent metal oxide material used for fabricating an oxide semiconductor layer is indium gallium zinc oxide (IGZO). Since the thin-film transistor made of IGZO (referred to as "IGZO thin-film transistor" below) has good flexible property and electrical property, and the processing temperature during the manufacture is low, the IGZO thin-film transistor is suitable to be used for forming flexible substrate. But the substrate made of IGZO has poor stability in air, and it is sensitive to oxygen and moisture, since oxygen and moisture may pass through the protection layer on the IGZO and deteriorates the property of the amorphous IGZO. Therefore, there is a need for provide a high-quality protective film on the IGZO to improve the stability of the TFT substrate.

Traditional IGZO thin film transistor substrate has a etch blocking structure on a IGZO layer, that is, a etch blocking layer made of SiNx or SiOx, thus the IGZO layer is protected and not destroyed when the source/drain electrode is fabricated, thereby enhancing the stability of the TFT substrate.

For example, as shown the FIG. 1, a structure of an IGZO thin film transistor in prior art is illustrated. The IGZO thin film transistor comprises: a gate metal layer 11 formed on a substrate; a gate insulating layer 12 formed on the gate metal layer 11; an oxide semiconductor layer 13 formed on the gate insulating layer 12; a blocking layer 14 (for example, the blocking layer is made of SiOx) formed on the IGZO semiconductor layer 13; a source/drain metal layer 15 formed on the blocking layer 14, the IGZO semiconductor layer 13 and the gate insulating layer 12; a passivation layer 16 formed on the source/drain metal layer 15, the gate insulating layer 12 and a part of the blocking layer 14; and a pixel electrode 17 formed on the passivation layer 16. Herein, the pixel electrode 17 is not a part of the IGZO thin film transistor, and it is necessarily to fabricate only when the display device, such as an array substrate, is to be produced.

The problem of the above-mentioned IGZO thin film transistor is that: the stability of the IGZO thin film transistor is still bad, since the interface characteristic and the crystal lattice match between the IGZO semiconductor layer and the gate insulating layer as well as the blocking layer is bad.

SUMMARY

For the problem of the prior art described above, the embodiments of the present invention provide an oxide semiconductor thin film transistor, a manufacturing method and a display device thereof, which can enhance the stability of the oxide semiconductor thin film transistor device, and improve the interface characteristic between the oxide semiconductor layer and the blocking layer.

According to one aspect of the present invention, an oxide semiconductor thin film transistor is provided and it comprises a gate insulating layer, an oxide semiconductor layer and a blocking layer, wherein a first transition layer is formed between the gate insulating layer and the oxide semiconductor layer, the oxygen content of the first transition layer is higher than the oxygen content of the oxide semiconductor layer.

According to another aspect of the present invention, a method of manufacturing the oxide semiconductor thin film transistor is provided and it comprises:

forming a gate metal layer on a substrate;
forming a gate insulating layer on the gate metal layer;
forming a first transition layer on the gate insulating layer;
forming an oxide semiconductor layer on the first transition layer, the oxygen content of the first transition layer is higher than the oxygen content of the oxide semiconductor layer;
forming a blocking layer on the oxide semiconductor layer;
forming a source/drain metal layer on the blocking layer, the oxide semiconductor layer and the gate insulating layer; and
forming a passivation layer on the source/drain metal layer, the gate insulating layer and part of the blocking layer.

According to still another aspect of the present invention, a display device is provided and it comprises the oxide semiconductor thin film transistor described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationships, and when the position of the object which is described is changed, the relative position relationship may be changed accordingly.

In the present invention, the nomenclature "oxygen content" refers to a ratio of the number of oxygen atoms to the total number of atoms in metal oxide layer, "oxygen amount" refers to the mass of used oxygen during formation (e.g., deposition by a sputtering method) of the metal oxide layer, and "mass percentage of oxygen in total sputtering gas" refers to the ratio of the mass of oxygen to the mass of total sputtering gas during the deposition of a metal oxide layer.

Embodiments of the present invention provide an oxide semiconductor thin film transistor, a manufacturing method and a display device thereof, which can enhance the stability of the IGZO thin film transistor device and improve the interface characteristic and the lattice matching between the oxide semiconductor layer and the SiOx. The bottom-gate type thin film transistor is described as an example below, but it should be understood that the present invention may also be used in a top-gate type thin film transistor.

Figure 1:
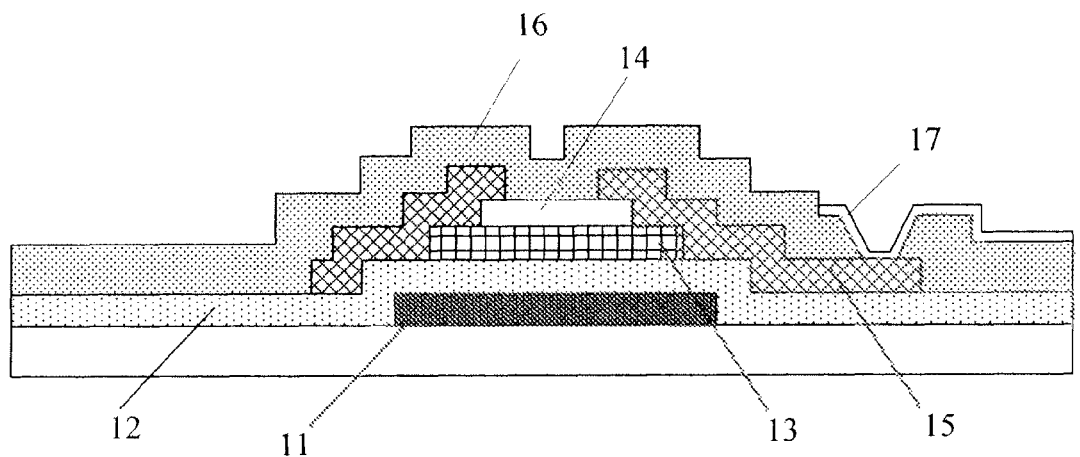
FIG. 1 schematically illustrates a configuration of an existing oxide semiconductor thin film transistor.
Figure 2:
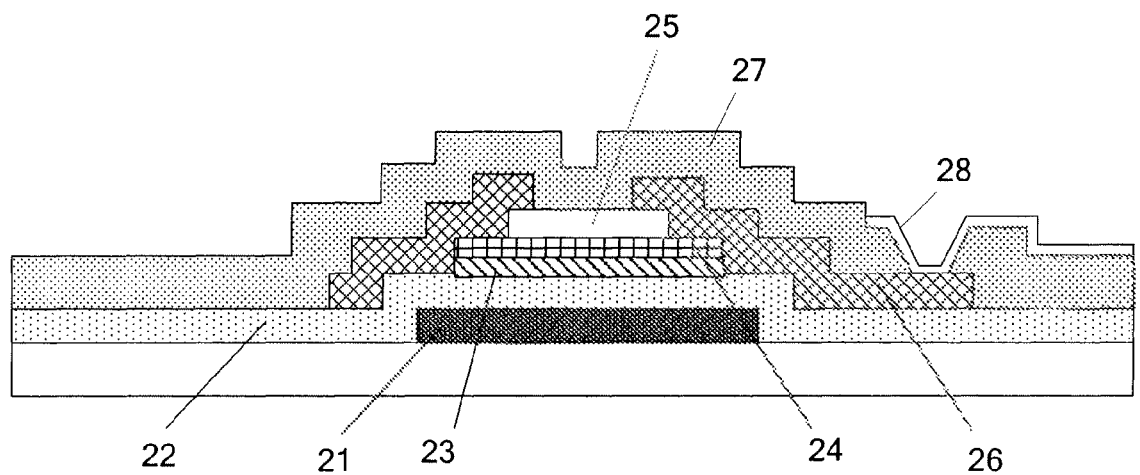
FIG. 2 illustrates a cross-section of a configuration of an oxide semiconductor thin film transistor in first embodiment of the present invention.

The cross section view of a configuration of an oxide semiconductor thin film transistor according to the first embodiment of the present invention is shown in FIG. 2. The thin film transistor comprises: a gate metal layer 21 formed on the substrate, a gate insulating layer 22 formed on the gate metal layer 21; a transition layer 23 formed on the gate insulating layer 22, an oxide semiconductor layer 24 formed on the transition layer 23, wherein the oxygen content of the transition layer 23 is higher than the oxygen content of the oxide semiconductor layer 24; and a blocking layer 25 formed on the oxide semiconductor layer 24; a source/drain metal layer 26 formed on the blocking 25, the oxide semiconductor layer 24 and the gate insulating layer 22; a passivation layer 27 formed on the source/drain metal layer 26, the gate insulating layer 22 and a part of the blocking layer 25. The pixel electrode layer 28 formed on the passivation layer 27 is not a part of the IGZO thin film transistor, and it is necessarily to fabricate only when the display device, such as an array substrate, is to be produced.

In the first embodiment, the transition layer 23 is formed between the gate insulating layer 22 and the oxide semiconductor layer 24, and the oxygen content of the transition layer 23 is higher than the oxygen content of the oxide semiconductor layer 24. In an example, the transition layer 23 and the oxide semiconductor layer 24 are made of the same metal oxide (e.g., the metal oxide containing indium, gallium, and zinc), but the oxygen content of the respective layers is different from each other. The indium gallium zinc oxide (IGZO) is described as an example below, but it should be understood that the metal oxide of is not limited to IGZO.

As an oxide semiconductor material, the characteristic of the IGZO is prone to be affected by the manufacturing process of the thin film, especially the oxygen amount in the atmosphere during the manufacture. When the oxygen amount is low during the manufacture, the oxygen content of the IGZO film is low, and the obtained IGZO is electrically conductive; when the oxygen amount is high during the manufacture, the oxygen content of the IGZO film is high, and the obtained IGZO is electrically insulated. When the transition layer 23 with higher oxygen content is disposed between the IGZO semiconductor layer 24 and the SiOx gate insulating layer 22, since the transition layer 23 is electrically insulating, the interface characteristic between the IGZO semiconductor layer 24 and the SiOx gate insulating layer 22 can be enhanced, the stability and the matching of the crystal lattice can be improved.

Specifically, in the present embodiment, the oxide semiconductor layer 24 and the transition layer 23 may be deposited by radio frequency magnetron sputtering method for example, the sputtering gas during the deposition contains oxygen ($O_2$) and the protective gas (e.g. nitrogen, argon, etc.). The oxygen content of the metal oxide after the deposition can be controlled by adjusting the proportion of $O_2$ in the sputtering gas during the deposition. For example, in manufacturing process of the thin film transistor, when the transition layer 23 is deposited on the gate insulating layer 22, the concentration of $O_2$ (namely the mass percentage of the oxygen in the total gas) is set in the range of 30%~100%. Next, when the oxide semiconductor layer 24 is deposited on the transition layer 23, the concentration of $O_2$ is adjusted to lower than the above concentration of 30%~100% when the transition layer 23 is deposited, for example, adjusted to in the range of 10%~30%. Finally, the measured oxygen content of the first transition layer is 35%~40%, and the oxygen content of the oxide semiconductor layer is 25~35%.

With the configuration of the present embodiment described above, the interface characteristic between the oxide semiconductor layer IGZO and the gate insulating layer SiOx can be improved, since there are some defects and a certain proportion of H ions existing in the gate insulating film, H ions combine with the oxygen in the metal oxide, thereby affecting the content and distribution of oxygen in the metal oxide semiconductor, and further affecting the stability of the oxide semiconductor. The transition layer plays a role of preventing H ions from combining with oxygen, thus the oxygen content of the metal oxide can be maintained at a certain level, which not only ensures the stability characteristic of the metal oxide, but also makes a better matching of the crystal lattice.

Figure 3:
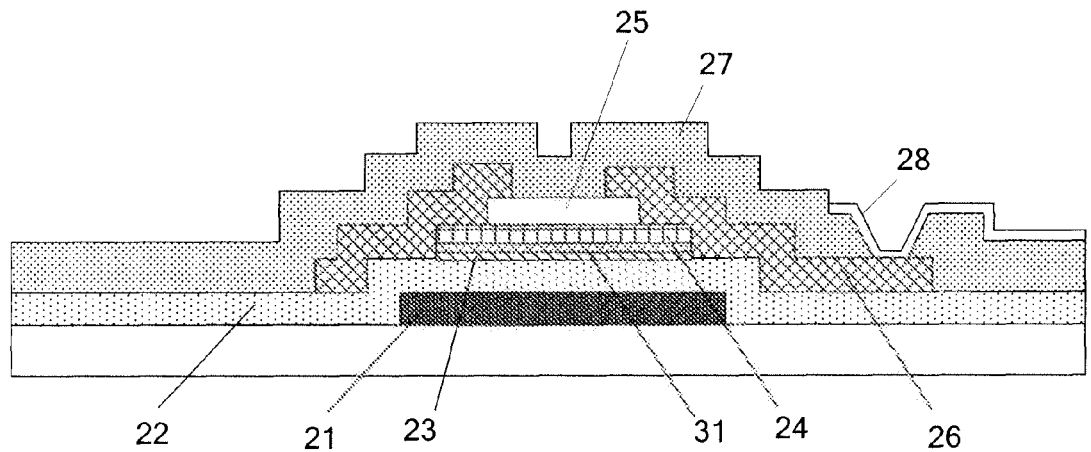
FIG. 3 illustrates a cross-section of a configuration of an oxide semiconductor thin film transistor in second embodiment of the present invention.

The cross section view of a configuration of an oxide semiconductor thin film transistor according to the second embodiment of the present invention is shown in FIG. 3. The thin film transistor comprises: a gate metal layer 21 formed on the substrate, a gate insulating layer 22 formed on the gate metal layer 21; a transition layer 23 formed on the gate insulating layer 22; a transition layer 31 formed on the transition layer 23; an oxide semiconductor layer 24 formed on the transition layer 31, wherein the oxygen content of the transition layer 23 is higher than the oxygen content of the oxide semiconductor layer 24; the oxygen content of the transition layer 31 is higher than the oxygen content of the oxide semiconductor layer 24 and lower than the oxygen content of the transition layer 23; and a blocking layer 25 formed on the oxide semiconductor layer 24; a source/drain metal layer 26 formed on the blocking 25, the oxide semiconductor layer 24 and the gate insulating layer 22; a passivation layer 27 formed on the source/drain metal layer 26, the gate insulating layer 22 and a part of the blocking layer 25. Alternatively, the thin film transistor may further comprises a pixel electrode layer 28 formed on the passivation layer 27.

Compared with the first embodiment, the present embodiment further comprises a transition layer 31, the material of the transition layer 31 is same to the material of the transition layer 23 and the oxide semiconductor layer 24 in the first embodiment, but its oxygen content is higher than the oxygen content of the oxide semiconductor layer 24 and lower than the oxygen content of the transition layer 23, thus the interface characteristic between the IGZO semiconductor layer 24 and the SiOx gate insulating layer 22 can be further enhanced, the stability and the matching of the crystal lattice can be further improved, and the electrical property of the TFT is significantly improved.

Figure 4:
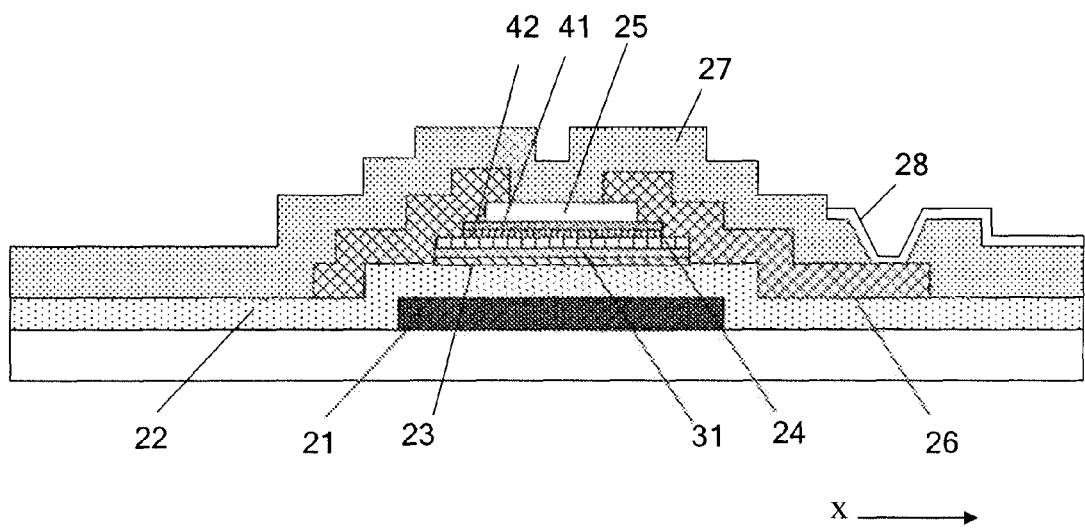
FIG. 4 illustrates a cross-section of a configuration of an oxide semiconductor thin film transistor in third embodiment of the present invention.

The cross section view of a configuration of an oxide semiconductor thin film transistor according to the third embodiment of the present invention is shown in FIG. 4. Compared with the second embodiment, the present embodiment further comprises a transition layer 41 and a transition layer 42 formed between the blocking layer 25 and the oxide semiconductor 24, wherein the oxygen content of the transition layer 41 is higher than the oxide semiconductor layer 24; the oxygen content of the transition layer 42 is higher than the oxygen content of the oxide semiconductor layer 24 and lower than the oxygen content of the transition layer 41. In the present embodiment, each of the oxide semiconductor layer 24, the transition layer 23, the transition layer 31, the transition layer 41, the transition layer 42 are made of the same metal oxide containing indium, gallium and zinc, for example, IGZO. Both the gate insulating layer 22 and the blocking layer 25 are made of SiOx.

In the present embodiment, the oxygen content of the transition layer 41 and the transition layer 42 is preferably same to that of the transition layer 23 and the transition layer 31, respectively, so as to reduce the times of setting preparation condition. However, the oxygen content of the four layers may also be different from each other.

Preferably, the length of the transition layer 41 and the length of the transition layer 42 in the direction of the channel (in x direction shown in FIG. 4) are shorter than the length of the oxide semiconductor layer 24, which can achieve better electrical contact between the source/drain electrode of the thin film transistor and the oxide semiconductor layer 24.

The transition layer 41 and the transition layer 42 may also be deposited by radio frequency magnetron sputtering method for example, the sputtering gas during the deposition contains oxygen ($O_2$) and the protective gas (e.g. nitrogen, argon, etc.). In the manufacturing process of the thin film transistor, when the oxide semiconductor layer 24 is deposited, the concentration of $O_2$ may be set in the range of 10%~30%; when the transition layer 41 is deposited, the concentration of $O_2$ is adjusted to higher than the above concentration of 10%~30% when the oxide semiconductor layer 24 is deposited, for example, adjusted to in the range of 30%~100%; when the transition layer 42 is deposited, the concentration of $O_2$ is further adjusted to higher than 10%~30% and lower than 30%~100%.

With the configuration of the present embodiment described above, not only the interface characteristic between the oxide semiconductor layer IGZO and the gate insulating layer SiOx but also the interface characteristic between the oxide semiconductor layer IGZO and the blocking layer SiOx can be improved, thus the stability of the thin film transistor can be enhanced. It should be understood that although the thin film transistor does not contain the transition zone 42, the same object can also be achieved.

According to the fourth embodiment of the present invention, there is also provides a method of manufacturing the oxide semiconductor thin film transistor, which comprising:

forming a gate metal layer 21 on a substrate;

forming a gate insulating layer 22 on the gate metal layer 21;

forming a first transition layer 23 on the gate insulating layer 22;

forming an oxide semiconductor layer 24 on the transition layer 23, the oxygen content of the transition layer 23 is higher than the oxygen content of the oxide semiconductor layer 24;

forming a blocking layer 25 on the oxide semiconductor layer 24;

forming a source/drain metal layer 26 on the blocking layer 25, the oxide semiconductor layer 24 and the gate insulating layer 22; and forming a passivation layer 27 on the source/drain metal layer 26, the gate insulating layer 22 and a part of the blocking layer 25.

As mentioned above, the oxygen content of the transition layer 23 can be controlled by adjusting the proportion of oxygen in the sputtering gas during the deposition. That is, the oxygen amount of the transition layer 23 during its deposition is controlled to be higher than the oxygen amount of the oxide semiconductor layer 24 during its deposition. In an example, when the transition layer 23 is deposited on the gate insulating layer 22, the mass percentage of the oxygen in the total gas may be in the range of 30%~100%. When the oxide semiconductor layer 24 is deposited on the transition layer 23, the mass percentage of the oxygen in the total gas may be in the range of 10%~30% for example, and lower than the mass percentage of the oxygen in the total sputtering gas when the transition layer 23 is formed.

Further, the method may further comprises a transition layer 31 formed between the transition layer 23 and the oxide semiconductor layer 24, the oxygen content of the transition layer 31 is higher than the oxygen content of the oxide semiconductor layer 24 and lower than that of the transition layer 23. In an example, when the transition layer 31 is deposited, the mass percentage of the oxygen in the total gas is higher than the mass percentage when the oxide semiconductor layer 24 is deposited and smaller than the mass percentage when the transition layer 23 is deposited.

In another embodiment, the method may further comprises a transition layer 41 formed between the blocking layer 25 and the oxide semiconductor layer 24, the oxygen content of the transition layer 41 is higher than the oxygen content of the oxide semiconductor layer 24.

Further, the method may further comprises a transition layer 42 formed between the transition layer 41 and the oxide semiconductor layer 24, the oxygen content of the transition layer 42 is higher than the oxygen content of the oxide semiconductor layer 24 and lower than that of the transition layer 41.

According to a fifth embodiment of the present invention, there is also provided a display device, which comprising the oxide semiconductor thin film transistor in any one of the embodiments above.

An example of the display device is a liquid crystal display device, in which the TFT array substrate and an opposed substrate are disposed opposite to each other so as to form a liquid crystal cell, and a liquid crystal material is filled in the liquid crystal cell. The opposed substrate is, for example, a color filter substrate. A pixel electrode in each pixel unit of the TFT array substrate acts to apply an electric field for controlling the rotation degree of the liquid crystal material, so as to conduct a display operation. In some examples, the liquid crystal display device further comprises a backlight source used to provide backlight for the TFT array substrate.

Another example of the display device is an organic electroluminescent display device (OLED), in which a laminated layer of the organic luminescent material is formed on the TFT array substrate, and a pixel electrode in each pixel unit of the TFT array substrate functions as an anode or a cathode for driving an organic light emitting material to emit light, so as to conduct a display operation.

Still another example of the display device is an E-paper display device, in which a layer of electron ink is formed on the TFT array substrate, and a pixel electrode in each pixel unit of the TFT array substrate is used to apply the voltage for driving charge particles to move in the electron ink, so as to conduct a display operation.

In summary, in the present invention, one or more transition layer is deposited between the oxide semiconductor layer and the gate insulating layer, so as to improve the interface characteristic therebetween; one or more transition layer is deposited between the oxide semiconductor layer and the blocking layer, so as to improve the interface characteristic between the blocking layer SiOx and the oxide semiconductor layer IGZO. Thus, the lattice matching can be improved and the stability of the oxide semiconductor IGZO thin film layer can be enhanced. The quality of the display image is directly affected by the electrical characteristic of the TFT, so the quality of the display image can be further enhanced. In addition, when the oxide semiconductor thin film transistor is used in manufacturing a display device, such as array substrate, the refresh frequency of the display device can be enhanced, and the quality of the image will not be affected. Of course, the thin film transistor in the present invention can also be used in other areas in addition to the display area, such as used in the field of integrated circuit manufacturing.

What are described above is related to the illustrative embodiments of the disclosure only and not limitative to the scope of the disclosure; the scopes of the disclosure are defined by the accompanying claims.

What is claimed:

1. A method of manufacturing an oxide semiconductor thin film transistor, comprising:
    forming a gate metal layer on a substrate;
    forming a gate insulating layer on the gate metal layer;
    forming a first transition layer on the gate insulating layer;
    forming an oxide semiconductor layer on the first transition layer, the oxygen content of the first transition layer is higher than the oxygen content of the oxide semiconductor layer;
    forming a blocking layer on the oxide semiconductor layer;
    forming a source/drain metal layer on the blocking layer, the oxide semiconductor layer and the gate insulating layer; and
    forming a passivation layer on the source/drain metal layer, the gate insulating layer and a part of the blocking layer;
    the method further comprising:
    forming a second transition layer between the blocking layer and the oxide semiconductor layer, the oxygen content of the second transition layer is higher than the oxygen content of the oxide semiconductor layer.

2. The method according to claim 1, wherein during the formation of the oxide semiconductor layer by a sputtering method, the mass percentage of oxygen in total sputtering gas is 10%~30%.

3. The method according to claim 1, further comprising: forming a third transition layer between the first transition layer and the oxide semiconductor layer, the oxygen content of the third transition layer is higher than the oxygen content of the oxide semiconductor layer and lower than that of the first transition layer.

4. The method according to claim 3, wherein the oxide semiconductor layer, the first transition layer and the third transition layer are made of the same metal oxide, but the oxygen content of the respective layers is different from each other.

5. The method according to claim 1, further comprising: a forth transition layer between the second transition layer and the oxide semiconductor layer, the oxygen content of the forth transition layer is higher than the oxygen content of the oxide semiconductor layer and lower than that of the second transition layer.

6. The method according to claim 5, wherein the oxide semiconductor layer, the second transition layer and the forth transition layer are made of the same metal oxide, but the oxygen content of the respective layers is different from each other.

7. The method according to claim 1, wherein during the formation of the first transition layer by a sputtering method, the mass percentage of oxygen in total sputtering gas is 30%~100%, which is also higher than the mass percentage of oxygen gas in total sputtering gas during the formation of the oxide semiconductor layer.

8. The oxide semiconductor thin film transistor according to claim 7, wherein during the formation of the third transition layer is formed by a sputtering method, the mass percentage of oxygen in the total gas is higher than the mass percentage of oxygen gas in total gas during the formation of the oxide semiconductor layer, and lower than the mass percentage of oxygen gas in total gas during the formation of the first transition layer.

9. An oxide semiconductor thin film transistor, comprising: a gate insulating layer, an oxide semiconductor layer and a blocking layer, wherein a first transition layer is formed between the gate insulating layer and the oxide semiconductor layer, the oxygen content of the first transition layer is higher than the oxygen content of the oxide semiconductor layer, and a second transition layer formed between the blocking layer and the oxide semiconductor layer, the oxygen content of the second transition layer higher than the oxygen content of the oxide semiconductor layer.

10. The oxide semiconductor thin film transistor according to claim 9, further comprising:
    a gate insulating metal layer formed on the substrate, wherein the gate insulating layer, the first transition layer, the oxide semiconductor layer and the blocking layer sequentially are formed on the gate insulating metal layer;
    a source/drain metal layer formed on the blocking layer, the oxide semiconductor layer and the gate insulating layer; and
    a passivation layer formed on the source/drain metal layer, the gate insulating layer and a part of the blocking layer.

11. The oxide semiconductor thin film transistor according to claim 9, wherein the oxide semiconductor layer is made of metal oxide containing indium, gallium and zinc.

12. The oxide semiconductor thin film transistor according to claim 9, wherein the oxygen content of the first transition layer is 35%~40%, the oxygen content of the oxide semiconductor layer is 25%~35%.

13. A display device, comprising the oxide semiconductor thin film transistor according to claim 9.

14. The oxide semiconductor thin film transistor according to claim 9, further comprising: a third transition layer formed between the first transition layer and the oxide semiconductor layer, the oxygen content of the third transition layer is higher than the oxygen content of the oxide semiconductor layer and lower than that of the first transition layer.

15. The oxide semiconductor thin film transistor according to claim 14, wherein the oxide semiconductor layer, the first transition layer and the third transition layer are made of the same metal oxide, but the oxygen content of the respective layers is different from each other.

16. The oxide semiconductor thin film transistor according to claim 9, further comprising: a forth transition layer formed between the second transition layer and the oxide semiconductor layer, the oxygen content of the forth transition layer is higher than the oxygen content of the oxide semiconductor layer and lower than that of the second transition layer.

17. The oxide semiconductor thin film transistor according to claim 16, wherein the oxide semiconductor layer, the second transition layer and the forth transition layer are made of the same metal semiconductor material, but the oxygen content of the respective layer is different from each other.

18. The oxide semiconductor thin film transistor according to claim 16, wherein the length of the second transition layer and the length of the forth transition layer along a direction of a channel is shorter than the length of the oxide semiconductor layer.

\* \* \* \* \*